(12) United States Patent
Ishii et al.

(10) Patent No.: US 7,782,571 B2
(45) Date of Patent: Aug. 24, 2010

(54) WIRED CIRCUIT BOARD AND PRODUCTION METHOD THEREOF

(75) Inventors: Jun Ishii, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 524 days.

(21) Appl. No.: 11/783,024

(22) Filed: Apr. 5, 2007

(65) Prior Publication Data

US 2007/0235219 A1 Oct. 11, 2007

Related U.S. Application Data

(60) Provisional application No. 60/847,113, filed on Sep. 26, 2006.

(30) Foreign Application Priority Data

| Apr. 5, 2006 | (JP) | ............................. 2006-104446 |
| Jan. 12, 2007 | (JP) | ............................. 2007-004559 |

(51) Int. Cl.
*G11B 5/48* (2006.01)

(52) U.S. Cl. .............. 360/245.8; 360/244.1; 360/244.2; 360/266.3; 360/245.9

(58) Field of Classification Search .............. 360/244.1, 360/244.2, 266.3, 245.8, 245.9
See application file for complete search history.

(56) References Cited

U.S. PATENT DOCUMENTS

| 6,801,402 B1 * | 10/2004 | Subrahmanyam et al. ........................ 360/245.9 |
| 2003/0151902 A1 | 8/2003 | Kageyama et al. |
| 2003/0194660 A1 * | 10/2003 | Sasaoka ...................... 430/350 |
| 2004/0221447 A1 | 11/2004 | Ishii et al. |
| 2005/0061542 A1 * | 3/2005 | Aonuma et al. ............. 174/255 |
| 2005/0117257 A1 | 6/2005 | Thaveeprungsriporn et al. |
| 2006/0187587 A1 * | 8/2006 | Arai et al. ................. 360/245.9 |

FOREIGN PATENT DOCUMENTS

| JP | 5-331431 | 12/1993 |
| JP | 9-207259 | 8/1997 |
| JP | 2003-124581 | 4/2003 |
| JP | 2003-203436 | 7/2003 |
| JP | 2003-204130 | 7/2003 |
| JP | 2004-35825 | 2/2004 |
| JP | 2004-158480 | 6/2004 |
| JP | 2004-335700 | 11/2004 |

* cited by examiner

*Primary Examiner*—N Drew Richards
*Assistant Examiner*—Jae Lee
(74) *Attorney, Agent, or Firm*—Jean C. Edwards, Esq.; Akerman Senterfitt (57) ABSTRACT

A wired circuit board includes a metal supporting board, an insulating base layer formed on the metal supporting board, a conductive pattern formed on the insulating base layer, a first semi-conductive layer formed on the conductive pattern, an insulating cover layer formed on the first semi-conductive layer, and a second semi-conductive layer formed on the insulating cover layer. The first semi-conductive layer and the second semi-conductive layer are electrically connected to the metal supporting board.

9 Claims, 4 Drawing Sheets

WIRED CIRCUIT BOARD AND PRODUCTION METHOD THEREOF

CROSS REFERENCE TO RELATED APPLICATION

This application claims the benefit of U.S. Provisional Application No. 60/847,113, filed Sep. 26, 2006, and claims priority from Japanese Patent Application No. 2007-4559, filed Jan. 12, 2007, and claims priority from Japanese Patent Application No. 2006-104446, filed Apr. 5, 2006, the contents of which are herein incorporated by reference in their entirety.

BACKGROUND OF THE INVENTION

1. Field of the Invention

The present invention relates to a wired circuit board and a production method thereof. More particularly, the present invention relates to a wired circuit board such as a flexible wired circuit board and a suspension board with circuit.

2. Description of the Related Art

The wired circuit board, such as a flexible wired circuit board and a suspension board with circuit, comprises an insulating base layer of a polyimide resin, a conductive layer of a copper foil and the like formed on the insulating base layer, and an insulating cover layer formed of a polyimide resin and the like formed on the base insulating layer to cover the conductive pattern. The wired circuit boards of this type are widely used in a variety of fields of electric and electronic devices.

In such wired circuit boards, in view of prevention of electrostatic discharge damage to the mounted electronic component, it has been proposed to form a conductive polymer layer on a cover layer to remove a static electricity by the conductive polymer layer (see Japanese Unexamined Patent Publication No. 2004-158480, for example).

SUMMARY OF THE INVENTION

However, the conductive polymer layer formed on the cover layer, described in Japanese Unexamined Patent Publication No. 2004-158480, alone is not sufficient to remove the static electricity, and may fail to reliably prevent an electronic component mounted from the electrostatic discharge damage.

It is an object of the present invention to provide a wired circuit board which can effectively remove the static electricity and reliably prevent an electronic component mounted from the electrostatic discharge damage, and a production method thereof.

The wired circuit board according to the present invention comprises a metal supporting board, an insulating base layer formed on the metal supporting board, a conductive pattern formed on the insulating base layer, a first semi-conductive layer formed on the conductive pattern, an insulating cover layer formed on the first semi-conductive layer, and a second semi-conductive layer formed on the insulating cover layer, wherein the first semi-conductive layer and the second semi-conductive layer are electrically connected to the metal supporting board.

In the wired circuit board of the present invention, it is preferable that the conductive pattern comprises a terminal portion exposed by opening the insulating cover layer, and the second semi-conductive layer has at least one end portion electrically connected to the terminal portion and at least the other end portion electrically connected to the metal supporting board.

In the wired circuit board of the present invention, it is preferable that the first semi-conductive layer and the second semi-conductive layer are in contact with each other.

In the wired circuit board of the present invention, it is further preferable that the value of surface resistance of the first semi-conductive layer is $10^5$ to $10^{13}\Omega/\square$ (or Ohms per square).

In the wired circuit board of the present invention, it is further preferable that the value of surface resistance of the second semi-conductive layer is $10^5$ to $10^{13}\Omega/\square$.

In the wired circuit board of the present invention, it is furthermore preferable that the first semi-conductive layer and the second semi-conductive layer are formed of a metal oxide.

In the wired circuit board of the present invention, it is further preferable that the value of surface resistance of the second semi-conductive layer is $10^4$ to $10^{12}\Omega/\square$.

In the wired circuit board of the present invention, it is furthermore preferable that the first semi-conductive layer is formed of a metal oxide and the second semi-conductive layer is formed of a conductive polymer.

A production method of the wired circuit board of the present invention comprising the steps of preparing a metal supporting board and forming an insulating base layer formed on the metal supporting board and a conductive pattern formed on the insulating base layer, forming a first semi-conductive layer so as to be electrically connected to the metal supporting board on a surface of the conductive pattern and on a surface of the insulating base layer exposed from the conductive pattern, forming an insulating cover layer on the first semi-conductive layer, removing the first semi-conductive layer exposed from the insulating cover layer, and forming a second semi-conductive layer so as to be electrically connected to the metal supporting board on a surface of the insulating cover layer and on a surface of the insulating base layer exposed from the insulating cover layer.

Further, in the production method of the wired circuit board of the present invention, it is preferable that the first semi-conductive layer is formed of a metal oxide in the step of forming the first semi-conductive layer, and the second semi-conductive layer is formed of a conductive polymer in the step of forming the second semi-conductive layer.

In the wired circuit board of the present invention, the wired circuit board comprises a first semi-conductive layer formed on the conductive pattern and a second semi-conductive layer formed on the insulating cover layer. The first semi-conductive layer and the second semi-conductive layer are electrically connected to a metal supporting board. Accordingly, the first semi-conductive layer and the second semi-conductive layer can effectively remove the static electricity charged on the conductive pattern and the insulating cover layer, and can reliably prevent the electronic component mounted from the electrostatic discharge damage.

According to the production method of the wired circuit board of the present invention, the method comprises steps of forming the first semi-conductive layer so as to be electrically connected to the metal supporting board on the surface of the conductive pattern and on the surface of the insulating base layer exposed from the conductive pattern, and forming a second semi-conductive layer so as to be electrically connected to the metal supporting board on the surface of the insulating cover layer and on the surface of the insulating base layer exposed from the insulating cover layer. Accordingly, in the wired circuit board obtained by the production method mentioned above, the first semi-conductive layer and the second semi-conductive layer can effectively remove the static electricity charged on the conductive pattern, the insulating base layer, and the insulating cover layer, and can reliably prevent the electronic component mounted from the electrostatic discharge damage.

DESCRIPTION OF THE EMBODIMENTS

Figure 1:
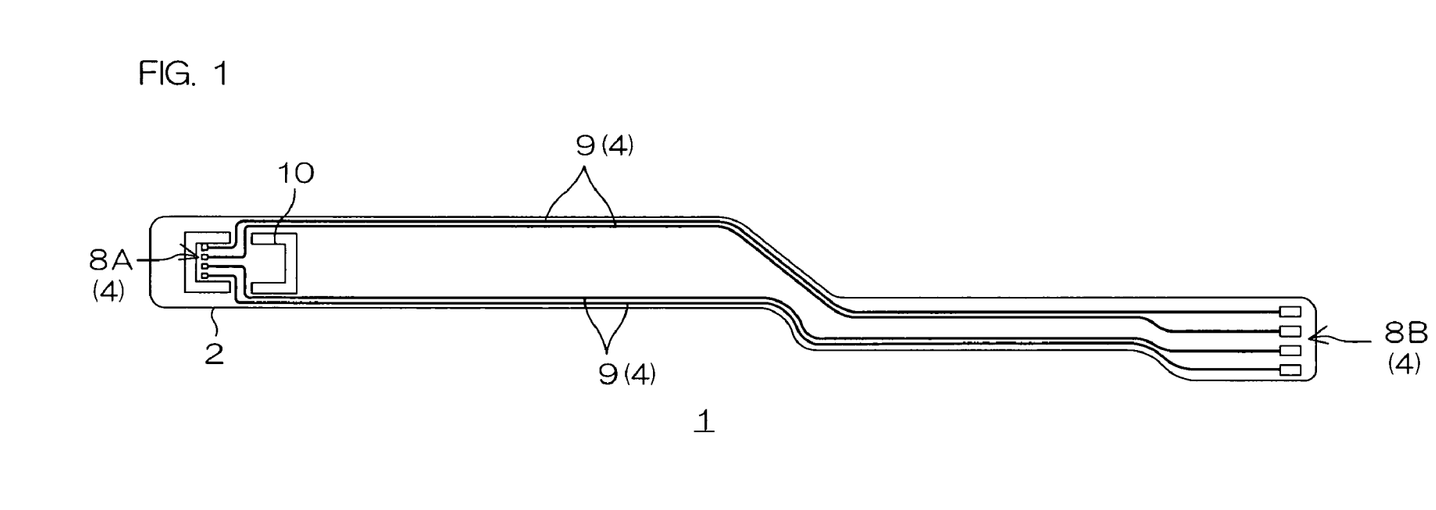
FIG. 1 is a schematic plan view showing a suspension board with circuit of an embodiment according to a wired circuit board of the present invention.
Figure 2:
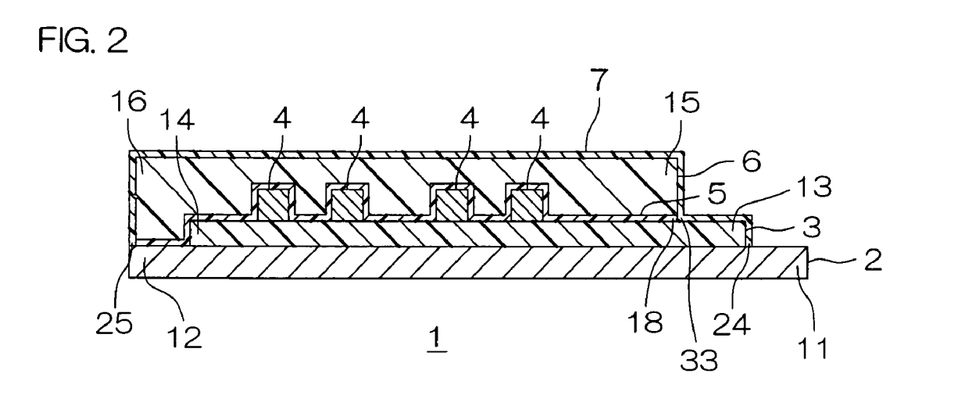
FIG. 2 is a cross sectional view of the suspension board with circuit shown in FIG. 1 taken along a width direction thereof.
Figure 3:
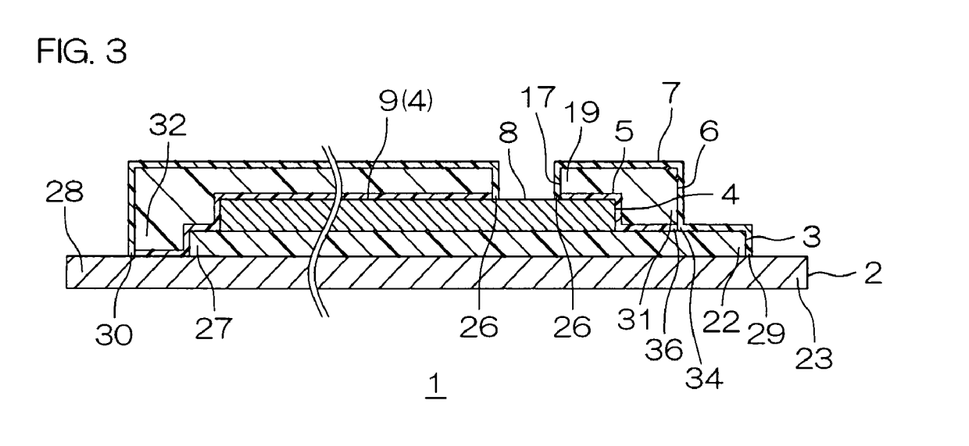
FIG. 3 is a cross sectional view of the suspension board with circuit shown in FIG. 1 taken along a longitudinal direction thereof.

FIG. 1 is a schematic plan view showing a suspension board with circuit of an embodiment according to a wired circuit board of the present invention. FIG. 2 is a cross sectional view of the suspension board with circuit shown in FIG. 1 taken along a width direction thereof. FIG. 3 is a cross sectional view of the suspension board with circuit shown in FIG. 1 taken along a longitudinal direction thereof. To clarify a relative arrangement of a conductive pattern 4 to a metal supporting board 2, an insulating base layer 3, a first semi-conductive layer 5, an insulating cover layer 6, and a second semi-conductive layer 7, all of which are mentioned later, are omitted from FIG. 1.

In the suspension board with circuit 1 of FIG. 1, a conductive pattern 4 for connecting a magnetic head and a read/write board (external) is integrally formed on a metal supporting board 2 which is mounted on a hard disc drive and mounts the magnetic head (not shown) thereon to support the magnetic head against an airflow generated when the magnetic head and a magnetic disk run relative to each other, while holding an extremely small space therebetween.

The conductive pattern 4 comprises a magnetic head connecting terminal portions 8A, external connection terminal portions 8B, and wires 9 for connecting therebetween, all being integrally and continuously formed as the conductive pattern 4.

The plurality of wires 9 extend along a longitudinal direction of the metal supporting board 2, and are arranged in parallel in spaced relationship with respect to the widthwise direction.

The magnetic head connecting terminal portions 8A are arranged at a front end portion of the metal supporting board 2, and the magnetic head connecting terminal portions 8A are arranged in parallel as a land with a greater width such that the front end portions of the respective wires 9 are connected respectively thereto. The magnetic head connecting terminal portions 8A are connected to the terminal portions (not shown) of the magnetic head.

The plurality of external connection terminal portions 8B are arranged at a rear end portion of the metal supporting board 2, and the external connection terminal portions 8B are arranged in parallel as a land with a greater width such that the rear end portions of the respective wires 9 are connected respectively thereto. The external connection terminal portions 8B are connected to the terminal portions (not shown) of the read/write board.

At a front end portion of the metal supporting board 2, a gimbal 10 is provided for mounting the magnetic head. The gimbal 10 is formed by cutting out the metal supporting board 2 so as to sandwich the magnetic head connecting terminal portions 8A in a longitudinal direction.

The suspension board with circuit 1 comprises, a metal supporting board 2, an insulating base layer 3 formed on the metal supporting board 2, a conductive pattern 4 formed on the insulating base layer 3, a first semi-conductive layer 5 formed on the conductive pattern 4, an insulating cover layer 6 formed on the first semi-conductive layer 5, and a second semi-conductive layer 7 formed on the insulating cover layer 6, as shown in FIGS. 2 and 3.

The metal supporting board 2 is formed of a planar sheet extending in a longitudinal direction which corresponds to the external shape of the suspension board with circuit 1 mentioned above.

The length (length in longitudinal direction) and the width (length in width direction) are selected depending on the purpose and application of the metal supporting board 2 if necessary.

The insulating base layer 3 is formed on the metal supporting board 2 in a pattern corresponding to the portion on which the conductive pattern 4 is formed. More specifically, the insulating base layer 3 is formed midway in a width direction of the metal supporting board 2 such that one end portion 11 in the width direction of the metal supporting board 2 and the other end portion 12 in the width direction of the metal supporting board 2 are exposed as shown in FIG. 2. The insulating base layer 3 is formed midway in a longitudinal direction of the metal supporting board 2 such that the one end portion 23 in a longitudinal direction of the metal supporting board 2 and the other end portion 28 in a longitudinal direction of the metal supporting board 2 are exposed as shown in FIG. 3.

The length and width of the insulating base layer 3 are selected to form a shape described above depending on the purpose and application if necessary.

The conductive pattern 4 is formed on the insulating base layer 3 in a wired circuit pattern, which integrally comprises a plurality of wires 9 disposed in parallel with each other in a spaced relationship as described above, the magnetic head connecting terminal portions 8A and the external connection terminal portions 8B each connected to the front end portion and the rear end portion of each of the wires 9. The magnetic head connecting terminal portion 8A and the external connection terminal portion 8B provided in this specification is collectively called "the terminal portion 8" hereinafter unless specified otherwise.

The width of each of the wires 9 is, for example, 10 to 100 μm, or preferably 15 to 50 μm. The interval between each of the wires 9 is, for example, 10 to 100 μm, or preferably 15 to 50 μm.

The width of each of the terminal portions 8 is, for example, 50 to 1000 μm, or preferably 80 to 500 μm. The interval between each of the terminal portions is, for example, 50 to 100 μm, or preferably 80 to 500 μm.

The first semi-conductive layer 5 is formed on the metal supporting board 2 and the insulating base layer 3 covered with the insulating cover layer 6 to cover the conductive pattern 4. To be more specific, the first semi-conductive layer 5 is formed to be interposed between the metal supporting board 2, the insulating base layer 3 and the conductive pattern 4, and the insulating cover layer 6.

The first semi-conductive layer 5 is formed in width direction such that the edge of the one end portion 13 in the width direction of the insulating base layer 3 and the edge of the other end portion 12 in the width direction of the metal supporting board 2 are exposed as shown in FIG. 2. Further, the first semi-conductive layer 5 is formed in the longitudinal direction such that the one end portion 22 in the longitudinal direction of the insulating base layer 3 and the other end portion 28 in the longitudinal direction of the metal supporting board 2 are exposed as shown in FIG. 3. Furthermore, the first semi-conductive layer 5 is formed so as to expose the terminal portion 8.

More specifically, the first semi-conductive layer 5 is continuously formed along the width and longitudinal directions on the upper surface and the side surfaces of the conductive pattern 4, on the upper surface of the insulating base layer 3 exposed from the conductive pattern 4 (excluding the upper surface of the one end portion 13 in the width direction and the one end portion 22 in the longitudinal direction of the insulating base layer 3), and on the upper surface of the metal supporting board 2 exposed from the insulating base layer 3 (excluding the upper surface of the one end portion 11 in the width direction and the one end portion 23 in the longitudinal direction of the metal supporting board 2).

This allows the first semi-conductive layer 5 to contact with and be electrically connected to the metal supporting board 2, the insulating base layer 3, and the conductive pattern 4 on the lower side in the thickness direction. This also allows the first semi-conductive layer 5 to contact with and be electrically connected to the insulating cover layer 6 on the upper side in the thickness direction.

The insulating cover layer 6 is formed on the first semi-conductive layer 5. More specifically, the insulating cover layer 6 is provided at a position identical to the first semi-conductive layer 5 as seen from top.

That is, the insulating cover layer 6 is continuously formed along the width and longitudinal direction on the upper surface and the side surfaces of the first semi-conductive layer 5 formed on the upper surface and the side surfaces of the conductive pattern 4, on the upper surface of the first semi-conductive layer 5 formed on the upper surface of the insulating base layer 3 exposed from the conductive pattern 4, on the side surfaces of the first semi-conductive layer 5 formed on the side surfaces of the insulating base layer 3 exposed from the conductive pattern 4 (side surface of the other end portion 14 in the width direction of the insulating base layer 3 and the side surfaces of the other end portion 27 in the longitudinal direction of the insulating base layer 3), and on the upper surface of the first semi-conductive layer 5 formed on the upper surface of the metal supporting board 2 exposed from the insulating base layer 3.

Further, the insulating cover layer 6 is formed with an opening 17 by opening a position corresponding to the terminal portion 8 as seen from top such that the terminal portion 8 are exposed from the opening 17 as shown in FIG. 3.

The length and width of the insulating cover layer 6 are selected to form a shape described above depending on the purpose and application if necessary.

The second semi-conductive layer 7 is formed on the surface of the insulating cover layer 6 and the surface of the insulating base layer 3 exposed from the insulating cover layer 6 as shown in FIGS. 2 and 3. That is, the second semi-conductive layer 7 is formed in the width direction such that the one end portion 11 in the width direction of the metal supporting board 2 is exposed from the second semi-conductive layer 7 and the upper surface of the other end portion 12 in the width direction of the metal supporting board 2 is covered with the second semi-conductive layer 7 as shown in FIG. 2. Further, the second semi-conductive layer 7 is formed in the longitudinal direction that the one end portion 23 in the longitudinal direction of the metal supporting board 2 and the other end portion 28 in the longitudinal direction of the metal supporting board 2 are exposed as shown in FIG. 3.

More specifically, the second semi-conductive layer 7 is continuously formed along the width and longitudinal direction on the upper surface and the side surfaces of the insulating cover layer 6 (side surfaces of the one end portion 15 in the width direction, side surfaces of the other end portion 16 in the width direction, side surfaces of the one end portion 31 in the longitudinal direction, and side surfaces of the other end portion 32 in the longitudinal direction), and on the upper surface and the side surfaces of the one end portion 13 in the width direction and one end portion 22 in the longitudinal direction of the insulating base layer 3 exposed from the first semi-conductive layer 5.

Further, the second semi-conductive layer 7 is formed so that the terminal portion 8 is exposed. More specifically, the second semi-conductive layer 7 is formed in the internal side of the insulating cover layer 6 in the opening 17 of the terminal portion 8. The lower end portion of the second semi-conductive layer 7 formed in the internal side of the insulating cover layer 6 (a fifth lower end portion 26 which is described below) is disposed on the upper surface of the peripheral end edge of the terminal portion 8.

Accordingly, the second semi-conductive layer 7 is provided in the width direction such that a first lower end portion 24 of the second semi-conductive layer 7 as the other end portion, which is disposed on the upper surface of the one end portion 11 in the width direction of the metal supporting board 2, and a second lower end portion 25 of the second semi-conductive layer 7 as the other end portion, which is disposed on the upper surface of the other end portion 12 in the width direction of the metal supporting board 2 are in contact with and electrically connected to the metal supporting board 2 as shown in FIG. 2. Further, the second semi-conductive layer 7 is provided in the longitudinal direction such that a third lower end portion 29 of the second semi-conductive layer 7 as the other end portion, which is disposed on the upper surface of the one end portion 23 in a longitudinal direction of the metal supporting board 2, and a fourth lower end portion 30 of the second semi-conductive layer 7 as the other end portion, which is disposed on the upper surface of the other end portion 28 in the longitudinal direction of the metal supporting board 2 are in contact with and electrically connected to the metal supporting board 2 as shown in FIG. 3.

In addition, the second semi-conductive layer 7 is provided such that the fifth lower end portion 26 of the second semi-conductive layer 7 as an one end portion, which is disposed on the upper surface of the peripheral edge of the terminal portion 8 is in contact with and electrically connected to terminal portion 8.

Moreover, the second semi-conductive layer 7 is provided in the width direction such that a first continuous portion 33 which is a continuous portion between the second semi-conductive layer 7 formed on the upper surface of the one end portion 13 in the width direction of the insulating base layer 3 and the second semi-conductive layer 7 formed on the side surface of the one end portion 15 in the width direction of the insulating cover layer 6 is in contact with and electrically connected to the one end portion 18 in the width direction of the first semi-conductive layer 5 as shown in FIG. 2. In addition, the second semi-conductive layer 7 is provided in the longitudinal direction such that a second continuous portion 34 which is a continuous portion between the second semi-conductive layer 7 formed on the upper surface of the one end portion 22 in a longitudinal direction of the insulating base layer 3 and the second semi-conductive layer 7 formed on the side surface of the one end portion 31 in the longitudinal direction of the insulating cover layer 6 is in contact with and electrically connected to the one end portion 36 in the longitudinal direction of the first semi-conductive layer 5 as shown in FIG. 3.

That is to say, the second semi-conductive layer 7 is in contact with and electrically connected to the metal supporting board 2, the insulating base layer 3, the terminal portion 8 of the conductive pattern 4, the first semi-conductive layer 5, and the insulating cover layer 6.

Additionally, in this suspension board with circuit 1, the upper surface of the terminal portion 8 (excluding the upper surface whereon the fifth lower end portion 26 of the second semi-conductive layer 7 is disposed) is formed with a metal plating layer (not shown).

Figure 4:
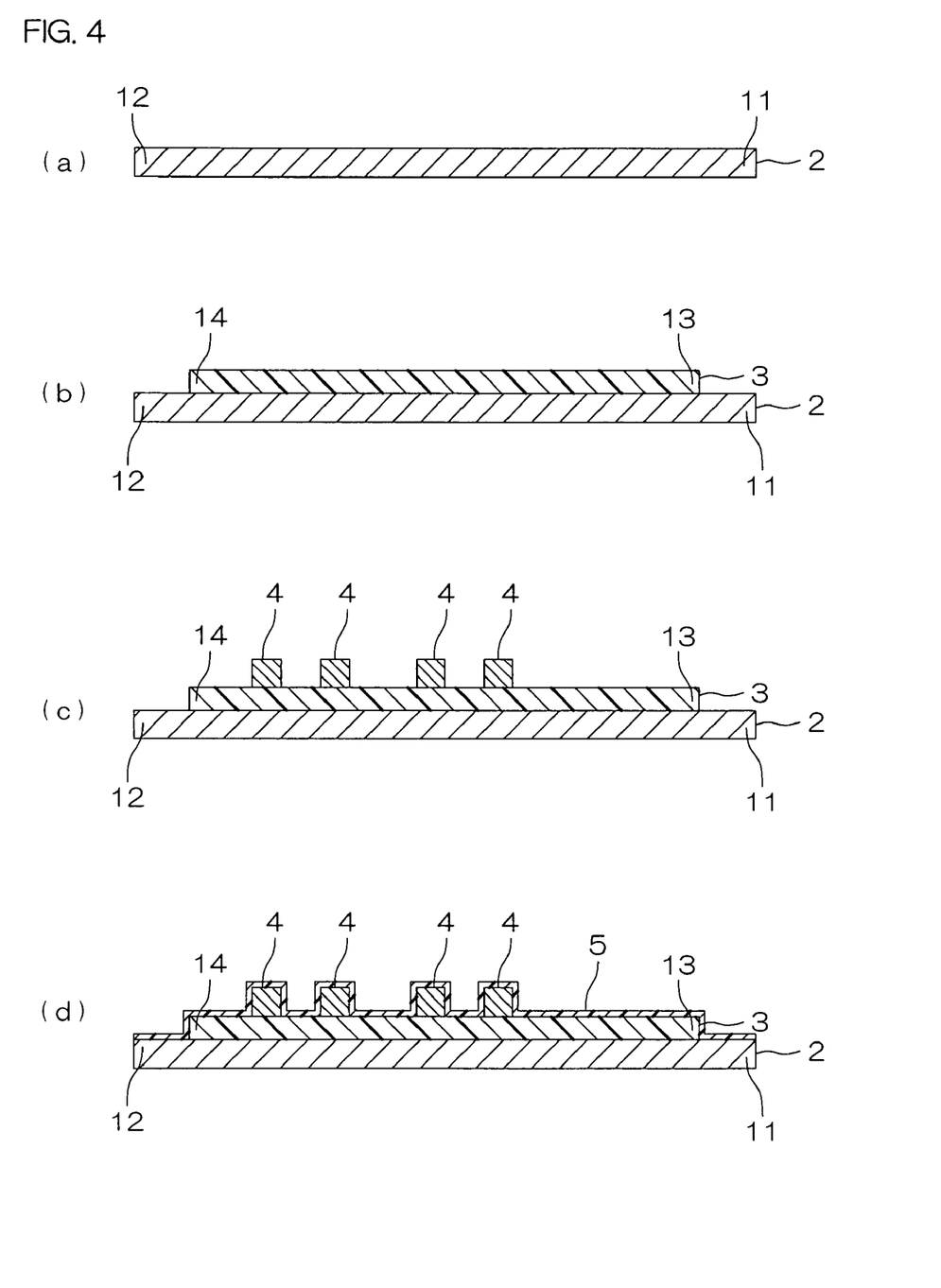
FIG. 4 is a cross sectional view showing a process for producing the suspension board with circuit shown in FIG. 1 taken along a width direction thereof,
 (a) showing a step of preparing a metal supporting board,
 (b) showing a step of forming an insulating base layer on the metal support board,
 (c) showing a step of forming a conductive pattern on the insulating base layer, and
 (d) showing a step of forming a first semi-conductive layer on the entire surface of the conductive pattern, the insulating base layer, and the metal supporting board in a continuous manner.
Figure 5:
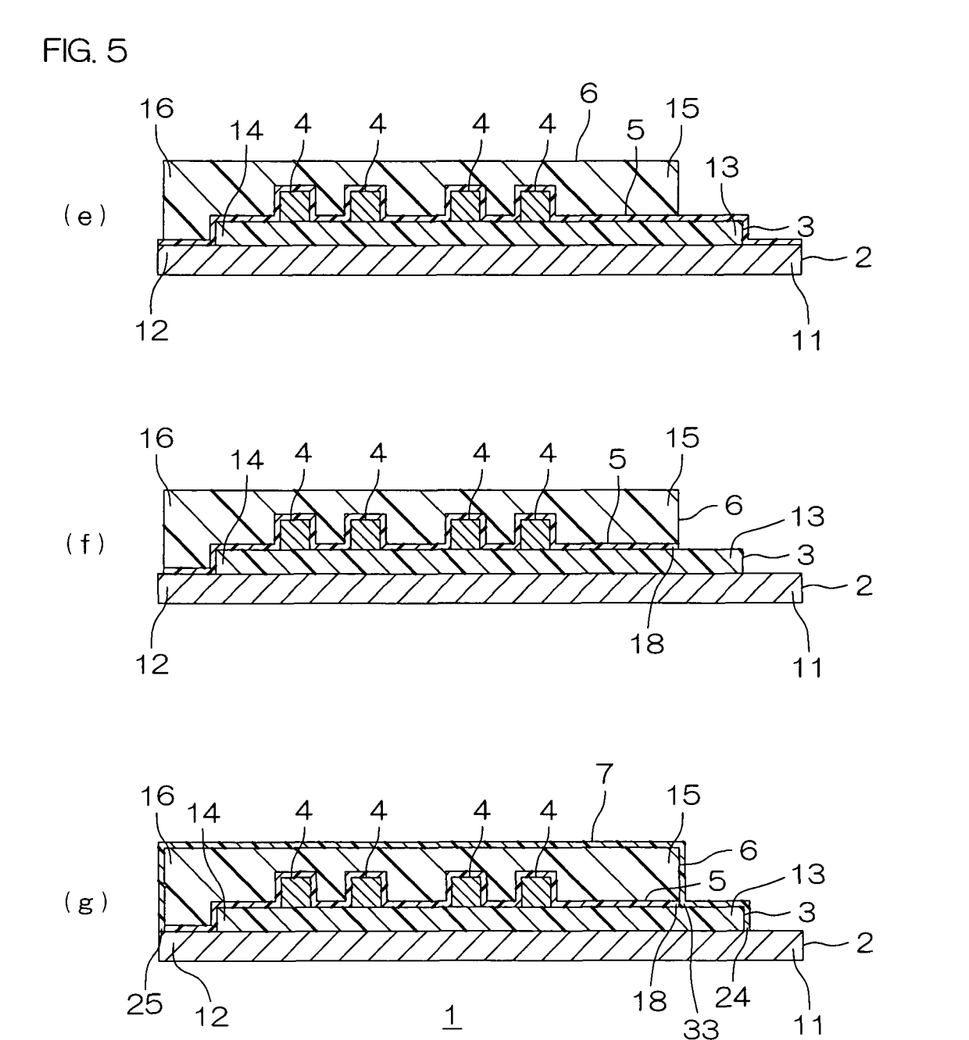
FIG. 5 is a cross sectional view showing a process for producing the suspension board with circuit shown in FIG. 1 taken along a width direction thereof, subsequently to FIGS. 4(a) through 4(d),
 (e) showing a step of forming an insulating cover layer on the first semi-conductive layer,
 (f) showing a step of removing the first semi-conductive layer exposed from the insulating cover layer; and
 (g) showing a step of forming a second semi-conductive layer on the surface of the insulating cover layer and on the surface of the insulating base layer exposed from the insulating base layer.

FIGS. 4 and 5 are cross sectional views in the width direction showing a process for producing the suspension board with circuit shown in FIG. 1.

The process for producing the suspension board with circuit is described hereinafter with reference to FIGS. 4 and 5.

In this process, the metal supporting board 2 is prepared as shown in FIG. 4(a).

As the metal supporting board 2, for example, metal foils such as stainless steel, 42 alloy, aluminum, copper-beryllium, and phosphor bronze is used. Preferably, stainless foil is used.

The metal supporting board 2 has a thickness of, for example, 10 to 50 μm, or preferably, 15 to 30 μm.

Then, in this process, the insulating base layer 3 is formed on the metal supporting board 2 in the pattern described above which corresponds to the portion on which the conductive pattern 4 is formed as shown in FIG. 4(b).

The insulating base layer 3 is formed of, for example, resins such as polyimide resin, polyamideimide resin, acrylic resin, polyether nitrile resin, polyether sulfone resin, polyether terephthalate resin, polyether naphthalate resin, polyvinyl chloride resin and the like. It is preferable that the insulating base layer 3 is formed of polyimide resin in view of heating resistance.

Formation of the insulating base layer 3 in the form of the pattern is not limited to a particular method, however any known methods may be used. For example, a varnish of photosensitive resin (photosensitive polyamic acid resin) is applied on the surface of the metal supporting board 2, and the applied varnish is dried to form a base coating. Then, the base coating is exposed to light through a photo mask, heated as required, and developed to form a pattern, and heated thereafter at a temperature of 250 and more under reduced pressure to be cured (imidized).

The thickness of the insulating base layer 3 which is formed as above is, for example, 1 to 35 μm, or preferably, 8 to 15 μm.

Thereafter, in this process, the conductive pattern 4 is formed on the insulating base layer 3 in the wired circuit pattern which integrally comprises the terminal portion 8 described above and the wire 9 as shown in FIG. 4(c).

The conductive pattern 4 is formed of conductors, such as, for example, copper, nickel, gold, solder, and an alloy thereof, or preferably, formed of copper. The conductive pattern 4 is formed on the upper surface of the insulating base layer 3 as the wired circuit pattern described above by a known patterning process such as, subtractive process, additive process and the like, preferably by the additive process.

In the subtractive process, a conductive layer is laminated on the upper surface of the insulating base layer 3 via an adhesive layer as required, and on this conductive layer, an etching resist which have a pattern identical to the wired circuit pattern is formed, then, the conductive layer is etched using the etching resist as a resist, and the etching resist is removed.

In the additive process, a conductive thin film is formed on the entire surface of the insulating base layer 3 (the upper surface and the side surface). The conductive thin film is laminated with a thin chromium film and a copper thin film by the sputtering process, or preferably, by a chromium sputtering process and a copper sputtering process.

Thereafter, a plating resist is formed on the upper surface of the conductive thin film in a pattern reverse to the wired circuit pattern, and then the conductive pattern 4 is formed on the upper surface of the conductive thin film exposed from the plating resist by electrolytic plating. Thereafter, the plating resist and the conductive thin film on which the plating resist is laminated are removed.

The thickness of the conductive pattern 4 which is formed as above is, for example, 3 to 20 μm, or preferably, 5 to 20 μm.

Thereafter, in this process, the first semi-conductive layer 5 is continuously formed on the surface of the conductive pattern 4, on the surface of the insulating base layer 3 which is exposed from the conductive pattern 4 and on the surface of the metal supporting board 2 which is exposed from the insulating base layer 3.

As a semi-conductive material which forms the first semi-conductive layer 5, metals or resins, or preferably, metals are used.

Metals, such as a metal oxide and the like are used. The metal oxide used includes, for example, chromium oxide, nickel oxide, copper oxide, titanium oxide, zirconium oxide, indium oxide, aluminum oxide, zinc oxide and the like. Preferably, chromium oxide is used.

Formation of the first semi-conductive layer 5 formed of metal oxide, is not limited to a particular method, however may employ methods such as, for example, sputtering using a metal as a target and heating for oxidation as required, reactive sputtering, and sputtering using metal oxide as a target.

In the process of sputtering using a metal as a target and heating for oxidation as required, the first semi-conductive layer 5 formed of metal oxide is formed by, for example, sputtering using a metal such as chromium and the like as a target and introducing an inert gas such as argon and the like as an introduction gas, and heating for oxidation, for example, in a heating furnace as required at a temperature of 50 to 400° C., for one minute to 12 hours in the air.

In the process of reactive sputtering, the first semi-conductive layer 5 formed of metal oxide is formed by, for example, sputtering using a metal such as chromium and the like as a target and introducing a reactive gas containing oxygen as an introduction gas in a sputtering apparatus.

In the process of sputtering using a metal oxide as a target, the first semi-conductive layer 5 formed of metal oxide is formed by, for example, sputtering using a metal oxide such as chromium oxide and the like as a target and introducing an inert gas such as argon and the like as an introduction gas in a sputtering apparatus.

It should be noted that the first semi-conductive layer 5 formed of metals (such as a metal oxide) described above may be formed in conformity with the disclosure of the Japanese Unexamined Patent Publication No. 2004-335700.

The resins include, for example, a semi-conductive resin composition in which conductive particles are dispersed.

The semi-conductive resin compositions contain, for example, an imide resin or an imide resin precursor, conductive particles and a solvent.

As for the imide resin, known imide resins such as, for example, polyimide, polyetherimide, polyamide-imide and the like can be used.

As for the imide resin precursor, for example, the imide resin precursor described in the Japanese Unexamined Patent Publication No. 2004-35825 may be used, and for example, polyamic acid resin may be used.

As for the conductive particle, for example, conductive polymer particles, carbon particles, metal particles, metal oxide particles and the like may be used.

As for the conductive polymer particles, for example, particles such as polyaniline, polypyrrole, polythiophene and the like, or derivative particles thereof may be used. Preferably, polyaniline particles are used. The conductive polymer particles are provided with electrical conductivity by doping using a doping agent.

As for the doping agent, for example, p-toluenesulfonic acid, dodecylbenzenesulfonic acid, alkylnaphthalenesulfonic acid, polystyrene sulfonic acid, p-toluenesulfonic acid novolac resin, p-phenolsulfonic acid novolac resin, β-naphthalenesulfonic acid formalin condensate and the like may be used.

The doping agent may be contained in a solvent in which the conductive polymer particles have been dispersed (dissolved). Alternatively, the suspension board with circuit 1 on which the first semi-conductive layer 5 has been formed and still during the producing process may be dipped into the solution of the doping agent.

As for the carbon particles, for example, carbon black particles such as carbon nanofiber and the like may be used.

As for the metal particles, for example, chromium, nickel, copper, titanium, zirconium, indium, aluminum, zinc and the like may be used.

As for the metal oxide particles, for example, particles of chromium oxide, nickel oxide, copper oxide, titanium oxide, zirconium oxide, indium oxide, aluminum oxide, zinc oxide and the like, or the particles of the complex oxide thereof, or more specifically, the particles of complex oxide (ITO particles) of indium oxide and tin oxide, the particles of complex oxide (PTO particles) of tin oxide and phosphorus oxide may be used.

The conductive particles can be used alone or in combination of two or more thereof, or preferably, the ITO particles are used.

The conductive particles have an average particle diameter of, for example, 10 nm to 1 μm, or preferably, 10 nm to 400 nm, or more preferably, 10 nm to 100 nm. When the conductive particles are carbon nanofiber, for example, the diameter thereof is 100 to 200 nm and the length is 5 to 20 μm. When the average particle diameter (diameter) is smaller than the one mentioned above, it may be difficult to adjust the average particle diameter (diameter) and when larger, conversely, it may not be suitable for the coating purpose.

The solvent is not limited to a particular one as long as it can disperse (dissolve) imide resin or imide resin precursor, and conductive particles. For example, aprotic polar solvents such as N-methyl-2-pyrolidone (NMP), N,N-dimethyl acetamide, N,N-dimethyl formamide, dimethyl sulfoxide and the like can be employed. Alternatively, these solvents can be used alone or in combination of two or more thereof.

The semi-conductive resin compositions may be prepared by mixing the imide resin or the imide resin precursor, the conductive particles, and the solvent mentioned above.

The formulation ratio of the conductive particles is, for example, 1 to 300 parts by weight, or preferably, 5 to 100 parts by weight for 100 parts by weight of imide resin or imide resin precursor. When the formulation ratio of the conductive particles is smaller than this, the electrical conductivity may be insufficient, or when larger, the excellent film characteristics of the imide resin or the imide resin precursor may be lost.

Further, the solvent is formulated such that the total amount of the imide resin or the imide resin precursor and the conductive particle is, for example, 1 to 40% by weight (solid concentration), or preferably, 5 to 30% by weight (solid concentration) in the semi-conductive resin composition. When the solid concentration is lower or higher than that, it may be difficult to control to a desired film thickness.

The semi-conductive resin composition prepared as described above is applied uniformly to cover the entire surface of the conductive pattern 4, the insulating base layer 3 exposed from the conductive pattern 4, and the metal supporting board 2 exposed from the insulating base layer 3 by a known application process, such as, for example, roll coating process, gravure coating process, spin coating process, bar coating process, and the like. The composition is then heated at a temperature of, for example, 60° C. to 250° C., or preferably, 80° C. to 200° C., for example, for 1 to 30 minutes, or preferably for 3 to 15 minutes and dried.

When the semi-conductive resin composition contains an imide resin precursor, the imide resin precursor is heated after drying at a temperature of, for example, 250° C. or more under reduced pressure to be cured (imidized).

Accordingly, the first semi-conductive layer 5 can be continuously formed on the surface of the conductive pattern 4, on the surface of the insulating base layer 3 exposed from the conductive pattern 4, on the surface of the metal supporting board 2 exposed from the insulating base layer 3.

The thickness of the first semi-conductive layer 5 formed as above is, for example, 1 to 40 μm, or preferably, 3 to 20 μm.

The value of surface resistance of the first semi-conductive layer 5 is set in a range of, for example, $10^5$ to $10^{13} \Omega/\square$, or preferably, $10^5$ to $10^{11} \Omega/\square$, or more preferably, $10^6$ to $10^9 \Omega/\square$. When the value of surface resistance of the first semi-conductive layer 5 is smaller than the value described above, malfunctions in the electronic components mounted may be caused, or when the value of surface resistance of the first semi-conductive layer 5 is larger, the electrostatic discharge damage cannot be prevented.

Thereafter, in this process, the insulating cover layer 6 is formed on the first semi-conductive layer 5 in the pattern described above as shown in FIG. 5(e).

As for the insulating material to form the insulating cover layer 6, an insulating material similar to the insulating base layer 3 is used, or preferably, a photosensitive synthetic resin, or more preferably, a photosensitive polyimide, is used.

To form the insulating cover layer 6 on the first semi-conductive layer 5 in the pattern described above, for example, a varnish of photosensitive polyamic acid resin is coated uniformly over the entire surface of the first semi-conductive layer 5 as in the process shown above. Then, the applied varnish is dried in the same manner as described above to form a cover coating.

Thereafter, the cover coating is exposed to light through a photo mask and heated at a predetermined temperature as required in the same manner as described above, and then, the portions which are not formed with the insulating cover layer 6 is removed by development in the same manner as described above. After that, the cover coating is heated, at a temperature of, for example, 250° C. or more under reduced pressure to be cured (imidized) to form the insulating cover layer 6.

Accordingly, the insulating cover layer 6 can be formed on the first semi-conductive layer 5 in the pattern described above.

The thickness of the insulating cover layer 6 formed as above is, for example, 1 to 40 μm, or preferably, 3 to 5 μm.

Thereafter, in this process, the first semi-conductive layer 5 exposed from the insulating cover layer 6 is removed as shown in FIG. 5(f).

The first semi-conductive layer 5 exposed from the insulating cover layer 6 is removed, for example, by etching.

The first semi-conductive layer 5 exposed from the insulating cover layer 6 is removed, for example, by wet etching in which alkaline aqueous solutions such as potassium hydroxide solution and the like are used as an etching solution, the insulating cover layer 6 is used as the etching resist and wet etching process or spraying process is used.

Accordingly, the first semi-conductive layer 5 can be formed at a position identical to the insulating cover layer 6 as seen from top. The first semi-conductive layer 5, which is not removed by covered with the insulating cover layer 6 is in contact with and electrically connected to the metal supporting board 2.

Thereafter, in this process, the second semi-conductive layer 7 is formed on the surface of the insulating cover layer 6 and on the surface of the insulating base layer 3 exposed from the insulating cover layer 6 in the pattern described above as shown in FIG. 5(g).

As for the semi-conductive material which forms the second semi-conductive layer 7, other than the metals and resins (semi-conductive resin compositions) described above, for example, resins which are formed of conductive polymers, or preferably, metals and conductive polymers are used.

As for the conductive polymer, for example, polyaniline, polypyrrole, polythiophene, or the derivatives thereof and the like, or preferably, polyaniline can be used. These conductive polymers can be used alone or in combination of two or more thereof.

To form the second semi-conductive layer 7 from the conductive polymers, for example, a polymerization process can be used, in which a polymer is precipitated by dipping the suspension board with circuit 1 into a polymeric liquid of the conductive polymer. Alternatively, in other process, for example, a solution of the conductive polymer is applied on the suspension board with circuit 1 and the solvent is dried.

In a polymerization process in which polymer is precipitated by dipping the suspension board with circuit 1 into a polymeric liquid of the conductive polymer, for example, the suspension board with circuit 1 which is in the producing process shown in FIG. 5(f) is dipped into the polymeric liquid of the conductive polymer and at the same time a polymerization initiator is mixed into the polymeric liquid.

The polymeric liquid of the conductive polymer can be prepared, for example, by mixing a monomer for polymerizing the conductive polymer and a solvent.

As for the monomer, for example, aniline, pyrrole, thiophene and the like, or preferably, aniline can be used. These monomers can be used alone or in combination of two or more thereof.

As for the solvent, for example, water, acidic aqueous solution and the like, or preferably, acidic aqueous solution can be used. As for the acidic constituent for forming the acidic aqueous solution, for example, inorganic acids such as hydrochloric acid, nitric acid, sulfuric acid, phosphoric acid and the like, or for example, organic acids such as, formic acid, acetic acid, oxalic acid and the like can be used. These solvents can be used alone or in combination of two or more thereof.

As for the polymerization initiator, for example, azo initiators such as 2,2'-azobisisobutyronitrile, 2,2'-azobis(2-methyl propionamidine) disulfate, 2,2'-azobis(2-methyl propionamidine) dihydrochloride, and the like, for example, persulfate initiators such as potassium persulfate (potassium peroxodisulfate), ammonium persulfate (ammonium peroxodisulfate), and the like, for example, peroxide initiators such as benzoyl peroxide, t-butyl hydroperoxide, hydrogen peroxide, and the like, for example, substituted ethane initiators such as phenyl substituted ethane, and the like, for example, carbonyl initiators such as aromatic carbonyl compound, and the like, for example, redox initiators such as a combination of persulfate and sodium acid bisulfite, a combination of peroxide and sodium ascorbate, and the like, can be used. These polymerization initiators can be used alone or in combination of two or more thereof.

To mix polymerization initiators into a polymeric liquid of the conductive polymer, a polymerization initiator solution, in which polymerization initiators are dissolved in the solvent, is prepared and the polymerization initiator solution can be mixed therein as required. The solvent used in the preparation of the polymerization initiator solution is the solvent identical to the one used in the preparation of the polymeric liquid.

The concentration of the monomer in the polymeric liquid of the conductive polymer is, for example, 0.005 to 0.5 mol/L, or preferably, 0.01 to 0.1 mol/L, and the concentration of the acidic constituent when the solvent is an acidic aqueous solution is, for example, 0.002 to 0.1 mol/L, or preferably, 0005 to 0.05 mol/L. The concentration of the polymerization initiator in the polymeric liquid when the polymerization initiator (or the polymerization initiator solution) is mixed is, for example, 0.002 to 0.2 mol/L, or preferably, 0.005 to 0.1 mol/L.

After the suspension board with circuit 1 described above is dipped in the polymeric liquid of the conductive polymer and the polymerization initiator is mixed therein, the suspension board with circuit 1 is dipped in the polymeric liquid of the conductive polymer for 5 to 180 minutes, for example, or preferably, 10 to 100 minutes. In the dipping, the polymeric liquid of the conductive polymer is set at a dipping temperature of, for example, 1° C. to 40° C., or preferably, 5° C. to 25° C.

Accordingly, the second semi-conductive layer 7 formed of the conductive polymer is polymerized so as to precipitate on the surface of the insulating cover layer 6 and on the surface of the insulating base layer 3 exposed from the insulating cover layer 6. The second semi-conductive layer 7 is in contact with and electrically connected to the metal supporting board 2.

Thereafter, the suspension board with circuit 1 on which the second semi-conductive layer 7 is formed in the production process is washed with water.

In this process, the conductive polymer of the second semi-conductive layer 7 is provided with electrical conductivity by doping if necessary.

To dope the conductive polymer of the second semi-conductive layer 7, the suspension board with circuit 1 formed with the second semi-conductive layer 7 thereon is dipped in the solution (doping solution) in which a doping agent is dissolved.

As for the doping agent, the one described above is used, and as for the solvent for dissolving the doping agent, for example, water, methanol and the like are used.

For preparation of the doping solution, the solvent is mixed such that the concentration of the doping agent is, for example, 5 to 100% by weight, or preferably, 10 to 50% by weight.

The dipping time of the suspension board with circuit 1 formed with the second semi-conductive layer 7 thereon is set at, for example, 30 seconds to 30 minutes, or preferably, 1 to 10 minutes. The dipping temperature of the doping solution is set at, for example, 10° C. to 70° C., or preferably, 20° C. to 60° C.

The doping of the second semi-conductive layer 7 described above provides electrical conductivity to the conductive polymer.

In this process, the suspension board with circuit 1 on which the second semi-conductive layer 7 is formed by doping the conductive polymer in the midway of producing process, is further washed in water.

Alternatively, the second semi-conductive layer 7 formed of conductive polymer mentioned above may be formed in conformity with, for example, the disclosure of the Japanese Unexamined Patent Publication No. 05-331431, the Japanese Unexamined Patent Publication No. 09-207259, the Japanese Unexamined Patent Publication No. 2003-124581, the Japanese Unexamined Patent Publication No. 2003-203436, the Japanese Unexamined Patent Publication No. 2003-204130, the Japanese Unexamined Patent Publication No. 2004-158480, and the like.

In other process, a solution of the conductive polymer is applied on the suspension board with circuit 1 and the solvent is dried. In this process, firstly, a solution of the conductive polymer is prepared.

To prepare the solution of the conductive polymer, for example, a monomer solution is mixed with a polymerization initiator solution to polymerize the monomer to obtain the conductive polymer. Then the obtained conductive polymer is dissolved in the solvent to prepare the solution of the conductive polymer.

The monomer solution is prepared by, for example, mixing the monomer and the solvent. As for the monomer, the one similar to the above is used. As for the solvent, the one used in the preparation of the polymeric liquid of the conductive polymer described above is used. As for the polymerization initiator solution, the one similar to the above is used.

The concentration of the monomer in the monomer solution is, for example, 0.001 to 1 mol/L, or preferably, 0.01 to 0.1 mol/L. The concentration of the acidic constituent when the solvent is an acidic aqueous solution is, for example, 0.001 to 1 mol/L, or preferably, 0.01 to 0.1 mol/L. The concentration of the polymerization initiator in the monomer solution when the polymerization initiator is mixed is, for example, 0.001 to 1 mol/L, or preferably, 0.01 to 0.1 mol/L.

The conductive polymer can be obtained by polymerizing the monomer described above. The conductive polymer powder can be obtained such that for example, the powder thus obtained is filtered and washed.

The solvent for preparing the solution of the conductive polymer is not limited to a particular one as long as the conductive polymer can be dissolved. For example, aprotic polar solvents such as N-methyl-2-pyrolidone (NMP), N,N-dimethyl acetamide, N,N-dimethyl formamide, dimethyl sulfoxide, 1,3-dimethyl-2-imidazolidine, sulfolane, and the like can be used.

In preparation of the conductive polymer solution, the solvent is mixed such that the concentration of the conductive polymer is, for example, 10 to 200 g/L, or preferably, 50 to 150 g/L.

Thereafter, the solution of the prepared conductive polymer is applied on the suspension board with circuit 1 which is in the midway of producing process as shown in FIG. 5(f) by, for example, known application methods such as casting. The solvent is then heated to dry at, for example, 50° C. to 150° C., or preferably 60° C. to 120° C., for 1 minute to 2 hours, for example.

Accordingly, the second semi-conductive layer 7 formed of the conductive polymer is formed so as to precipitate on the surface of the insulating cover layer 6 and the surface of the insulating base layer 3 exposed from the insulating cover layer 6. The second semi-conductive layer 7 is in contact with and electrically connected to the metal supporting board 2.

Thereafter, the suspension board with circuit 1 on which the second semi-conductive layer 7 is formed in the midway of producing process is washed with water.

In this process, the conductive polymer of the second semi-conductive layer 7 is provided with electrical conductivity by doping if necessary. The conductive polymer of the second semi-conductive layer 7 is doped in the same manner as in the above.

Thereafter, the suspension board with circuit 1 on which the second semi-conductive layer 7 is formed by doping the conductive polymer in the midway of producing process is further washed with water.

Alternatively, the second semi-conductive layer 7 mentioned above on which the conductive polymer is formed may be formed in conformity with, for example, the disclosure of the Japanese Unexamined Patent Publication No. 2002-275261.

To form the second semi-conductive layer 7 of metals or resins (semi-conductive resin compositions), the same manner is employed as in the formation of the first semi-conductive layer 5.

For example, to obtain the second semi-conductive layer 7 formed of metals or semi-conductive resin compositions, first, the second semi-conductive layer 7 is formed over the entire surface of the insulating cover layer 6, the first semi-conductive layer 5, the insulating base layer 3, and the metal supporting board 2 in the same manner as in the formation of the first semi-conductive layer 5.

Then, on the second semi-conductive layer 7 formed over the entire surface of each of the layers mentioned above, an etching resist is formed in a pattern identical to the pattern of the second semi-conductive layer 7. After that, the second semi-conductive layer 7 exposed from the etching resist is etched, and the etching resist is removed, thereby forming the second semi-conductive layer 7 in the pattern described above.

Accordingly, the second semi-conductive layer 7 formed of metals or semi-conductive resin compositions can be formed in the pattern described above on the surface of the insulating cover layer 6 and the insulating base layer 3 exposed from the insulating cover layer 6. The second semi-conductive layer 7 is in contact with and electrically connected to the metal supporting board 2.

The second semi-conductive layer 7 thus formed has a thickness of, for example, 1 to 40 μm, or preferably, 3 to 20 μm.

The value of surface resistance of the second semi-conductive layer 7 is set in a range of, for example, $10^4$ to $10^{12}\Omega/\square$, or preferably, $10^5$ to $10^{11}\Omega/\square$, or more preferably, $10^6$ to $10^{10}\Omega/\square$ when the second semi-conductive layer 7 is formed of conductive polymers. The value of surface resistance of the second semi-conductive layer 7 is set in a range of, for example, $10^5$ to $10^{13}\Omega/\square$, or preferably, $10^5$ to $10^{11}\Omega/\square$, or more preferably, $10^6$ to $10^9\Omega/\square$ when the second semi-conductive layer 7 is formed of metals or semi-conductive resin compositions. When the value of surface resistance of the second semi-conductive layer 7 is smaller than the value described above, malfunctions in the electronic components mounted may be caused, or when the value of surface resistance of the second semi-conductive layer 7 is larger, the electrostatic discharge damage may not be prevented.

Thereafter, in this process, a metal plating layer (not shown) is formed on the upper surface of the terminal portion 8 if necessary. Then the metal supporting board 2 is cut out by chemical etching to form a gimbal 10 and its outline at the same time to obtain the suspension board with circuit 1 as shown in FIG. 1.

This suspension board with circuit 1 comprises the first semi-conductive layer 5 formed on the conductive pattern 4 and the second semi-conductive layer 7 formed on the insulating cover layer 6, and the first semi-conductive layer 5 and the second semi-conductive layer 7 are in contact with and electrically connected to the metal supporting board 2. Further, the first semi-conductive layer 5 is formed to be interposed between the metal supporting board 2, the insulating base layer 3, and the conductive pattern 4, and the insulating cover layer 6. The second semi-conductive layer 7 is formed also on the surface of the insulating base layer 3 exposed from the insulating cover layer 6. Accordingly, the first semi-conductive layer 5 and the second semi-conductive layer 7 allows the static electricity charged on the conductive pattern 4, the insulating base layer 3, and the insulating cover layer 6 to be release (grounded) to the metal supporting board 2 to effectively remove the charged electrostatic, thereby reliably preventing the electrostatic discharge damage on the electronic components to be mounted.

Further, in this suspension board with circuit 1, the conductive pattern 4 comprises a terminal portion 8 exposed by opening of the insulating cover layer 6. The second semi-conductive layer 7 has a fifth lower end portion 26 that is in contact with and electrically connected to the terminal portion 8. The first lower end portion 24, the second lower end portion 25, the third lower end portion 29 and the fourth lower end portion 30 thereof are in contact with and electrically connected to the metal supporting board 2. This configuration allows the static electricity charged on the terminal portion 8 to be released (grounded) to the metal supporting board 2 via the second semi-conductive layer 7 to effectively remove the charged electrostatic, thereby reliably preventing the electrostatic discharge damage on the electronic components to be mounted.

Furthermore, in this suspension board with circuit 1, the first semi-conductive layer 5 and the second semi-conductive layer 7 are in contact with each other. More specifically, on the one end portion side in the width direction, the first continuous portion 33 of the second semi-conductive layer 7 is in contact with the one end portion 18 in the width direction of the first semi-conductive layer 5, and on the one end portion side in the longitudinal direction, the second continuous portion 34 of the second semi-conductive layer 7 is in contact with the one end portion 36 in the longitudinal direction of the first semi-conductive layer 5. This contact, therefore, allows to improve efficiency of the electrostatic movement (grounding), whereby the static electricity can be more effectively removed.

In the description above, the first semi-conductive layer 5 and the second semi-conductive layer 7 can be formed of different types of semi-conductive materials, for example, the first semi-conductive layer 5 can be formed of metals and the second semi-conductive layer 7 can be formed of resins. Or inversely, the first semi-conductive layer 5 can be formed of resins and the second semi-conductive layer 7 can be formed of metals. Further, the first semi-conductive layer 5 and the second semi-conductive layer 7 can be formed of an identical semi-conductive material, that is, both the first semi-conductive layer 5 and the second semi-conductive layer 7 are formed of metals or resins.

Preferably, both the first semi-conductive layer 5 and the second semi-conductive layer 7 are formed of metal oxide, or more preferably, of chromium oxide.

More specifically, when both the first semi-conductive layer 5 and the second semi-conductive layer 7 are formed of metal oxide, the first semi-conductive layer 5 and the second semi-conductive layer 7 can be formed with ease since no conductive processes such as doping and the like, or no rinsing processes such as water washing and the like are required, thereby allowing easier producing process of the suspension board with circuit 1.

Preferably, the first semi-conductive layer 5 is formed of metal oxide and the second semi-conductive layer 7 is formed of conductive polymer. More preferably, the first semi-conductive layer 5 is formed of chromium oxide and the second semi-conductive layer 7 is formed of polyaniline.

More specifically, when the first semi-conductive layer 5 is formed of metal oxide and the second semi-conductive layer 7 is formed of conductive polymer, the first semi-conductive layer 5 can be reliably formed on the surface of the insulating base layer 3 since the first semi-conductive layer 5 is covered with the insulating cover layer 6. Further, the second semi-conductive layer 7 can be reliably formed on the surface of the insulating cover layer 6 since the conductive polymer of the second semi-conductive layer 7 and the insulating cover layer 6 (resin) are highly adhesive with each other. Furthermore, when the second semi-conductive layer 7 is formed of the conductive polymer, the second semi-conductive layer 7 can be formed with ease since no removing processes such as etching and the like are required, thereby allowing easier producing process of the suspension board with circuit 1.

Although in the description above, the first semi-conductive layer 5 is formed so as to be in contact with the metal supporting board 2, the first semi-conductive layer 5 can be formed, for example, so as not to contact directly with the metal supporting board 2 while being electrically connected to the metal supporting board 2.

More specifically, though not shown, the first semi-conductive layer 5 is to be electrically connected in the width direction to the metal supporting board 2 through the second semi-conductive layer 7 (first continuous portion 33), not formed on the upper surface of the other end portion 12 in the width direction of the metal supporting board 2 and on the side surfaces of the other end portion 14 in the width direction of the insulating base layer 3. Further, the first semi-conductive layer 5 is to be electrically connected in the longitudinal direction to the metal supporting board 2 through the second semi-conductive layer 7 (second continuous portion 34), not formed on the upper surface of the other end portion 28 in the longitudinal direction of the metal supporting board 2 and on the side surfaces of the other end portion 27 in the longitudinal direction of the insulating base layer 3.

Although in the description above, the second semi-conductive layer 7 is formed so as to be in contact with the metal supporting board 2, the second semi-conductive layer 7 can be formed, for example, so as not to contact directly with the metal supporting board 2 while being electrically connected to the metal supporting board 2.

More specifically, though not shown, the second semi-conductive layer 7 is to be electrically connected in the width direction to the metal supporting board 2 through the first semi-conductive layer 5 (one end portion 18 in the width direction of the first semi-conductive layer 5), not formed on the side surfaces of the one end portion 13 in the width direction of the insulating base layer 3 and on the side surfaces of the other end portion 16 in the width direction of the insulating cover layer 6. Further, the second semi-conductive layer 7 is to be electrically connected to the metal supporting board 2 in the longitudinal direction through the first semi-conductive layer 5 (one end portion 36 in the longitudinal direction of the first semi-conductive layer 5), not formed on the side surfaces of the one end portion 22 in the longitudinal direction of the insulating base layer 3 and on the side surfaces of the other end portion 32 in the longitudinal direction of the insulating cover layer 6.

EXAMPLES

While in the following, the present invention is described in further detail with reference to Examples, the present invention is not limited to any of the Examples.

Example 1

(Both First Semi-conductive Layer and Second Semi-conductive Layer are Formed of Chromium Oxide)

A metal supporting board formed of a stainless foil having a thickness of 20 μm was prepared (see FIG. 4(a)).

On the surface of the metal supporting board, a varnish of photosensitive polyamic acid resin was applied uniformly using a spin coater. The applied varnish was heated at a temperature of 90° C. for 15 minutes to form a base coating. The base coating was then exposed to light at 700 mJ/cm$^2$ through a photo mask, heated at a temperature of 190° C. for 10 minutes, and developed using an alkaline developer. Thereafter, the developed base coating was cured at a temperature of 385° C. under a reduced pressure of 1.33 Pa. As a result, an insulating base layer formed of photosensitive polyimide was formed on a metal supporting board in the pattern corresponding to a portion on which a conductive pattern was formed (see FIG. 4(b)). The thickness of the insulating base layer was 10 μm.

A conductive pattern formed of a copper foil having a thickness of 10 μm was formed by an additive process on the upper surface of the insulating base layer in the wired circuit pattern wherein the terminal portion and the wires were integrally formed (see FIG. 4(c)).

Thereafter, the first semi-conductive layer was formed of a sputtering coating of a thin chromium film by a sputtering process using chromium as a target continuously over the entire surface of the conductive pattern, the insulating base layer exposed from the conductive pattern, and the metal supporting board exposed from the insulating base layer.

The sputtering was conducted by a process in conformity with the disclosure of the Japanese Unexamined Patent Publication No. 2004-335700 under conditions shown below.
Target: Cr
Ultimate vacuum: 1.33×10$^{-3}$ Pa
Flow rate of introduced gas (Argon): 2.0×10$^{-3}$ m$^3$/h
Operating pressure: 0.16 Pa
Temperature of earth electrode: 20° C.
Electric power: DC180 W
Sputtering time: 5 seconds
Thickness of sputtering coating: 0.01 μm Then, the surface of the sputtering coating of thin chromium film was oxidized by heating at 125° C. for 12 hours in the air, whereby the first semi-conductive layer of the chromium oxide layer was formed (see FIG. 4(d)). The thickness of the first semi-conductive layer was 0.005 μm.

The formation of the first semi-conductive layer of the chromium oxide was confirmed by ESCA. When a value of surface resistance of the first semi-conductive layer was measured at a temperature of 25° C. and a humidity of 15% using a surface resistance measuring device (Hiresta-up MCP-HT450 available from Mitsubishi Chemical Corporation), it was 3×10$^8$Ω/□.

Thereafter, a varnish of photosensitive polyamic acid resin was coated uniformly over the entire surface of the first semi-conductive layer using a spin coater and heated at a temperature of 90° C. for 10 minutes to form a cover coating having a thickness of 7 μm. The cover coating was exposed to light through the photo mask at 700 mJ/cm$^2$ and heated at a temperature of 180° C. for 10 minutes, and then developed using an alkaline developer, thereby forming the patterned cover coating. The patterned cover coating was cured at a temperature of 385° C. under a reduced pressure of 1.33 Pa. As a result, an insulating cover layer formed of photosensitive polyimide was formed on the first semi-conductive layer in the pattern described above (see FIG. 5(e)). The thickness of the insulating cover layer was 5 μm.

Thereafter, the first semi-conductive layer exposed from the insulating cover layer was removed by wet etching using a potassium hydroxide solution using the insulating cover layer as an etching resist (see FIG. 5(f)).

Next, the second semi-conductive layer was continuously formed on the entire surface of the cover insulating layer, the first semi-conductive layer, the insulating base layer, and the metal supporting board in the same manner as in the formation of the first semi-conductive layer. On the second semi-conductive layer, an etching resist was formed, and then, the second semi-conductive layer exposed from the etching resist was removed by etching to form the second semi-conductive layer in the pattern described above (see FIG. 5(g)). The thickness of the second semi-conductive layer was 0.005 μm.

The formation of the second semi-conductive layer of the chromium oxide was confirmed by ESCA. When a value of surface resistance of the second semi-conductive layer was measured at a temperature of 25° C. and a humidity of 15% using a surface resistance measuring device (Hiresta-up MCP-HT450 available from Mitsubishi Chemical Corporation), it was 2×10$^8$Ω/□.

Thereafter, a metal plating layer was formed on a surface of the terminal portion, and the metal supporting board 2 was cut out by chemical etching to form a gimbal and its outline. The suspension board with circuit (see FIG. 1) was obtained by the processes mentioned above.

Example 2

(First Semi-conductive Layer Formed of Chromium Oxide and Second Semi-conductive Layer Formed of Polypyrrole)

In stead of formation of the second semi-conductive layer of chromium oxide, the same processes as in Example 1 were taken to obtain a suspension board with circuit, except that the second semi-conductive layer was formed of polypyrrole obtained by polymerization of pyrrole as a monomer (see FIG. 1). The second semi-conductive layer was formed in conformity with Example 1 described in the Japanese Unexamined Patent Publication No. 2004-158480.

The thickness of the second semi-conductive layer was 0.01 μm.

When a value of surface resistance of the second semi-conductive layer was measured at a temperature of 25° C. and a humidity of 15% using a surface resistance measuring device (Hiresta-up MCP-HT450 available from Mitsubishi Chemical Corporation), it was $5 \times 10^6 \Omega/\square$.

Example 3

(First Semi-conductive Layer Formed of Chromium Oxide and Second Semi-conductive Layer Formed of Polyaniline)

In stead of formation of the second semi-conductive layer of chromium oxide, the same processes as in Example 1 were taken to obtain a suspension board with circuit, except that the second semi-conductive layer was formed of polyaniline (see FIG. 1).

An NMP solution of polyaniline was applied and the NMP was dried to form the second semi-conductive layer.

To form the second semi-conductive layer, first, a polyaniline powder was prepared.

In preparation of the polyaniline powder, 6000 g of distilled water, 360 mL of 36% hydrochloric acid, and 400 g (4.295 mol) of aniline were mixed and stirred in a separable flask of 10 liter capacity having a stirrer, a thermometer and a straight-pipe adaptor to prepare a monomer solution of aniline. Into the monomer solution of aniline, 1927 g (sulfuric acid: 4.295 mol) of 28% sulfuric acid solution was added while cooled. Next, 3273 g (ammonium peroxodisulfuric: 4.295 mol) of 30% polymerization initiator solution was dropped gradually while stirring and cooling of the monomer solution of aniline so as to be maintained at a temperature of −3° C. or below. Thereafter, the reaction solution was further stirred for one hour so as to be maintained at a temperature of −3° C. or below. Accordingly, a polyaniline powder was precipitated.

Then, after filtered off, water washed and acetone washed, the polyaniline powder was poured into 4 L of 2N ammonia water and stirred for five hours at 5000 rpm using an autohomomixer. The polyaniline powder was further filtered off, sufficiently water washed and acetone washed to prepare the polyaniline powder.

Thereafter, 10 g of the prepared polyaniline powder was dissolved in 90 g of NMP to prepare a NMP solution of polyaniline.

The NMP solution of polyaniline was applied over the suspension board with circuit described above by casting.

After dried at a temperature of 80° C. for one hour, the second semi-conductive layer of polyaniline was formed. Then the suspension board with circuit with the second semi-conductive layer formed thereon was dipped in 20% by weight of p-phenolsulfonic acid novolac resin solution at a temperature of 80° C. for 10 minutes to dope the second semi-conductive layer and then water washed (see FIG. 5(g)).

The doped second semi-conductive layer formed of polyaniline had a thickness of 30 nm. When a value of surface resistance of the doped second semi-conductive layer was measured at a temperature of 25° C. and a humidity of 15% using a surface resistance measuring device (Hiresta-up MCP-HT450 available from Mitsubishi Chemical Corporation), it was $1 \times 10^7 \Omega/\square$.

(Evaluation)

Charge Damping Property

For each suspension board with circuit obtained by Examples 1 to 3, a charge damping capacity was evaluated using a Nanocoulombmeter available from Kasuga Electric Works Ltd.

The result was that, in the insulating cover layer, it took 0.10 seconds for damping the electric charge of 0.1 nC and the standard deviation was 0.01 in any suspension board with circuit of Examples 1 to 3.

The result was that, in the insulating base layer, it took 0.10 seconds for damping the electric charge of 0.1 nC and the standard deviation was 0.01 in any suspension board with circuit of Examples 1 to 3.

The results confirmed that in any suspension board with circuit of Examples 1 to 3, the charge of the static electricity in both the insulating cover layer and the insulating base layer could be effectively removed.

While the illustrative embodiments of the present invention are provided in the above description, such is for illustrative purpose only and it is not to be construed limitative. Modification and variation of the present invention that is obvious to those skilled in the art is covered by the following claims.

What is claimed is:

1. A wired circuit board, comprising:
   a metal supporting board;
   an insulating base layer formed on the metal supporting board;
   a conductive pattern formed on the insulating base layer;
   a first semi-conductive layer formed on top of the conductive pattern;
   an insulating cover layer formed on top of the first semi-conductive layer; and
   a second semi-conductive layer formed on top of the insulating cover layer, such that the insulating cover layer is sandwiched in between the first semi-conductive layer and the second semi-conductive layer; wherein
   the first semi-conductive layer and the second semi-conductive layer are electrically connected to the metal supporting board.

2. The wired circuit board according to claim 1, wherein the conductive pattern comprises a terminal portion exposed by opening the insulating cover layer, and the second semi-conductive layer has at least one end portion electrically connected to the terminal portion and at least the other end portion electrically connected to the metal supporting board.

3. The wired circuit board according to claim 1, wherein the first semi-conductive layer and the second semi-conductive layer are in contact with each other.

4. The wired circuit board according to claim 1, wherein a value of surface resistance of the first semi-conductive layer is $10^5$ to $10^{13} \Omega/\square$.

5. The wired circuit board according to claim 1, wherein a value of surface resistance of the second semi-conductive layer is $10^5$ to $10^{13} \Omega/\square$.

6. The wired circuit board according to claim 1, wherein the first semi-conductive layer and the second semi-conductive layer are formed of a metal oxide.

7. The wired circuit board according to claim 1, wherein a value of surface resistance of the second semi-conductive layer is $10^4$ to $10^{12} \Omega/\square$.

8. The wired circuit board according to claim 1, wherein the first semi-conductive layer is formed of a metal oxide and the second semi-conductive layer is formed of a conductive polymer.

9. The wired circuit board according to claim 1, wherein the second semi-conductive layer covers the conductive pattern, except for a terminal portion of the conductive pattern exposed by an opening in the insulating cover layer, and also covers the first semi-conductive layer.

* * * * *